(12) United States Patent
Lv et al.

(10) Patent No.: US 7,800,246 B2
(45) Date of Patent: Sep. 21, 2010

(54) ELECTRONIC DEVICE WITH REDUNDANT FAN CONTROL FUNCTION

(75) Inventors: Teng Lv, Shenzhen (CN); Lei Yang, Shenzhen (CN); Guo-Yi Chen, Shenzhen (CN); Jun Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 139 days.

(21) Appl. No.: 12/331,398

(22) Filed: Dec. 9, 2008

(65) Prior Publication Data

US 2010/0066172 A1    Mar. 18, 2010

(30) Foreign Application Priority Data

Sep. 12, 2008    (CN)    ......................... 2008 1 0304494

(51) Int. Cl.
*H02J 1/10* (2006.01)
*H02J 3/14* (2006.01)
(52) U.S. Cl. ......................................................... 307/29
(58) Field of Classification Search .................... 307/29
See application file for complete search history.

*Primary Examiner*—Fritz M Fleming
*Assistant Examiner*—Dru M Parries
(74) *Attorney, Agent, or Firm*—Zhigang Ma

(57) ABSTRACT

An electronic device with redundant fan control function includes a first fan, a first control module, a first power supply, a first switch unit, a second fan, a second control module, a second power supply, and a second switch unit. When the first power supply stops working, the second power supply powers the first fan and the second fan, and the first power supply sends a control signal to turn on the first switch unit to allow a group of control information output by the second control module to control the first fan. Therefore, the first fan and the second fan can work normally to dissipate heat from the electronic device.

9 Claims, 2 Drawing Sheets

ELECTRONIC DEVICE WITH REDUNDANT FAN CONTROL FUNCTION

BACKGROUND

1. Technical Field

The present disclosure relates to electronic devices, and particularly to an electronic device with redundant fan control function.

2. Description of the Related Art

Generally, an electronic device, such as a storage system based on a storage bridge bay (SBB) standard, includes two power supply devices cooperatively powering external loads. Each of the power supply devices includes two fans configured for dissipating heat from the electronic device. When one power supply device does not work, the two fans therein will not work either. Therefore, the other power supply device will alone power the external loads and only by the two fans therein to dissipate heat, which may be too little and lead to damage to the electronic device.

DETAILED DESCRIPTION

Figure 1:
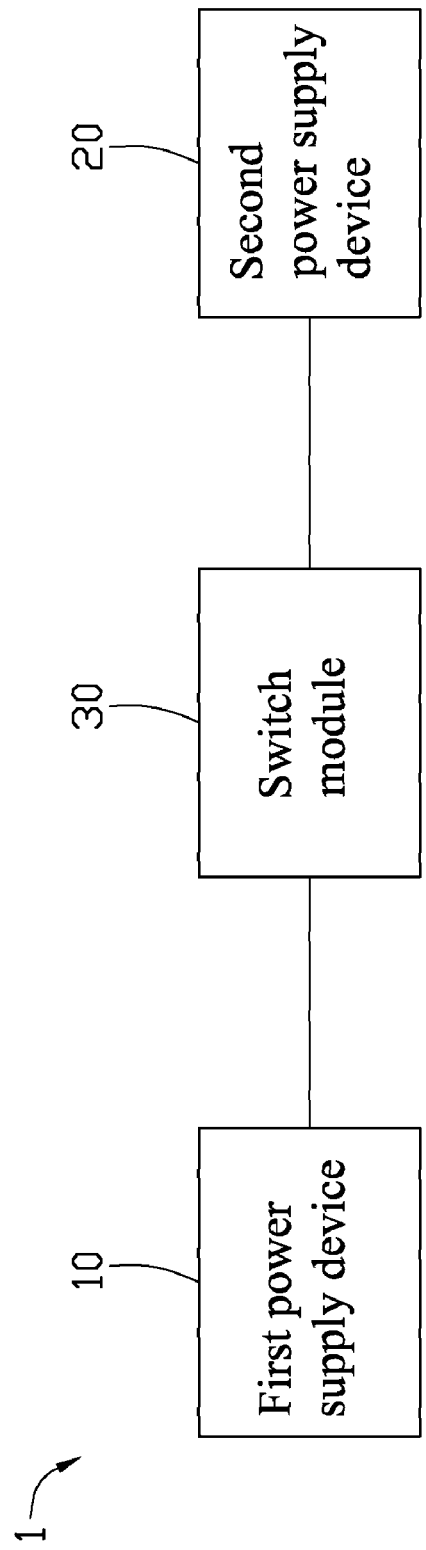
FIG. 1 is a block diagram of an embodiment of an electronic device with redundant fan control function.

Referring to FIG. 1, an embodiment of an electronic device 1 with redundant fan control function, includes a first power supply device 10, a second power supply device 20, and a switch module 30. The first power supply device 10 is connected to the second power supply device 20 via the switch module 30. In one embodiment, the switch module 30 may be mounted on a midplane (not shown) of the electronic device 1. Each of the first power supply device 10 and the second power supply device 20 is connected to the electronic device 1 via a connector (not shown) mounted on the midplane. The first power supply device 10 and the second power supply device 20 can supply power to external loads and a variety of signals can be transmitted among the first power supply device 10, the switch module 30, and the second power supply device 20, by the connectors, and the midplane. In one embodiment, the electronic device 1 is a storage device, and the midplane is a printed circuit board.

Figure 2:
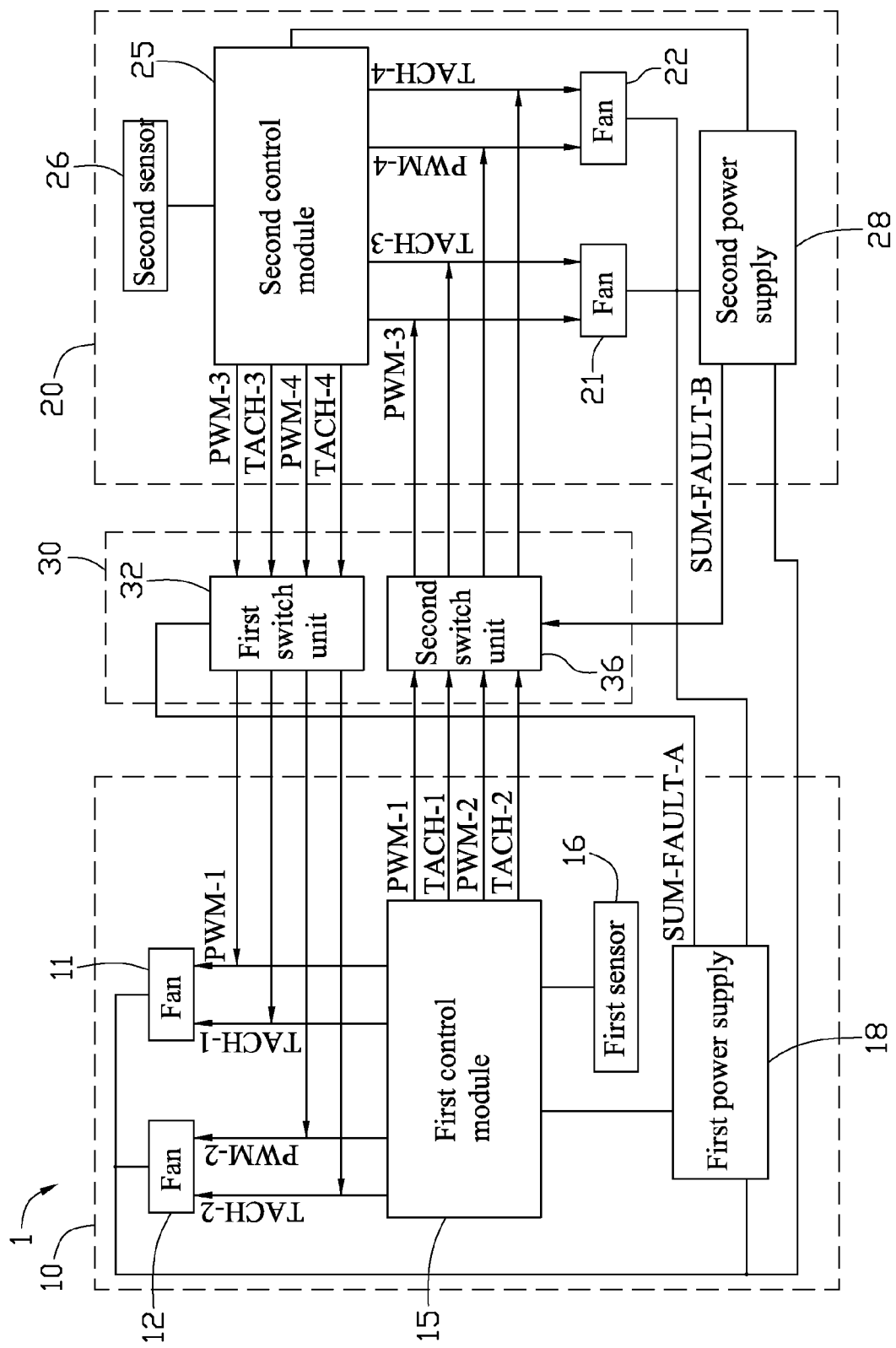
FIG. 2 is one embodiment of a circuit diagram of FIG. 1.

Referring to FIG. 2, the first power supply device 10 includes two fans 11, 12, a first control module 15, a first sensor 16, and a first power supply 18. The first control module 15 is connected to the fans 11, 12, the first sensor 16, and the switch module 30. In this embodiment, the first control module 15 is connected to the first sensor 16 via an inter-integrated circuit (I2C) bus. The first sensor 16 is configured for sensing temperature of the electronic device 1, and transmitting the sensed temperature to the first control module 15 via the I2C bus. The first control module 15 is configured for sending two control signals PWM1, PWM2 and two detecting signals TACH1, TACH2 to the fans 11, 12 and the switch module 30 based on the sensed temperature. The control signals PWM1, PWM2 are pulse width modulation signals configured for controlling the rotation speed of the fans 11, 12. The detecting signals TACH1, TACH2 are configured for detecting the actual rotation speed of the fans 11, 12.

The second power supply device 20 includes two fans 21, 22, a second control module 25, a second sensor 26, and a second power supply 28. The second control module 25 is connected to the fans 21, 22, the second sensor 26, and the switch module 30. In this embodiment, the second control module 25 is connected to the second sensor 26 via the I2C bus. The second sensor 26 is configured for sensing temperature of the electronic device 1, and transmitting the sensed temperature to the second control module 25 via the I2C bus. The second control module 25 is configured for sending two control signals PWM3, PWM4 and two detecting signals TACH1, TACH2 to the fans 21, 22 and the switch module 30 based on the sensed temperature. The control signals PWM3, PWM4 are pulse width modulation signals configured for controlling the rotation speed of the fans 21, 22. The detecting signals TACH1, TACH2 are configured for detecting the actual rotation speed of the fans 21, 22.

The first power supply 18 is connected to the fans 11, 12, 21, 22, the first control module 15, and the switch module 30, and is configured for supplying power to the fans 11, 12, 21, 22, and the first control module 15, and sending a control signal SUM-FAULT-A to the switch module 30. The control signal SUM-FAULT-A is at a high level, such as 5V, when the first power supply 18 is working, and goes to a low level, such as 0V, when the first power supply 18 stops working. The second power supply 28 is connected to the fans 11, 12, 21, 22, the second control module 25, and the switch module 30, and is configured for supplying power to the fans 11, 12, 21, 22 and the second control module 25, and sending a control signal SUM-FAULT-B to the switch module 30. The control signal SUM-FAULT-B is at a high level, such as 5V, when the second power supply 28 is working, and goes to a low level, such as 0V, when the second power supply 28 stops working.

The switch module 30 includes a first switch unit 32, and a second switch unit 36. The first switch unit 32 is configured for responding to the control signal SUM-FAULT-A. The first switch unit 32 is further configured for connecting the second control module 25 and the fans 11, 12, and is capable of transferring the control signals PWM3, PWM4, and the detecting signals TACH3, TACH4 to the fans 11, 12. The second switch unit 36 is configured for responding to the control signal SUM-FAULT-B. The second switch unit 36 is further configured for connecting to the first control module 15 and the fans 21, 22, and is capable of transferring the control signals PWM1, PWM2, and the detecting signals TACH1, TACH2 to the fans 21, 22. In one embodiment, the first switch unit 32 and the second switch unit 36 are bus switches SN74CBT3124DR from the Texas Instruments company. However, other bus switches having similar functions can be used.

When the first power supply 18 and the second power supply 28 work normally, the fans 11, 12, 21, 22 dissipate heat normally, the first power supply 18 sends the control signal SUM-FAULT-A at a high level to turn off the first switch unit 32, and the second power supply 28 sends the control signal SUM-FAULT-B at a high level to turn off the second switch unit 36.

If the first power supply 18 stops working, the first control module 15 and the first sensor 16 cannot work either. At this time, the control signal SUM-FAULT-A will go to a low level to turn on the first switch unit 32. Thus, the second control module 25 sends the control signals PWM3, PWM4, and the detecting signals TACH3, TACH4 to the fans 11, 12 via the first switch unit 32, and the fans 11, 12 are powered by the second power supply 28. Therefore, the fans 11, 12 can continue to dissipate heat.

If the second power supply 28 stops working, the second control module 25 and the second sensor 26 cannot work either. At this time, the control signal SUM-FAULT-B will go to a low level to turn on the second switch unit 36. Thus, the first control module 15 sends the control signals PWM1, PWM2, and the detecting signals TACH1, TACH2 to the fans 21, 22 via the second switch unit 36, and the fans 21, 22 are powered by the first power supply 18. Therefore, the fans 21, 22 can continue to dissipate heat.

In summary, the electronic device 1 with redundant fan control function can assure the fans 11, 12, 21, 22 work normally to dissipate heat in order to prevent the electronic device 1 from overheating damage, even though one of the first power supply 18 and the second power supply 28 stops working.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device with redundant fan control function comprising:
    a switch module comprising a first switch unit and a second switch unit;
    a first power supply device comprising:
        a first power supply capable of controlling the first switch unit to turn on and turn off;
        at least one first fan connected to the first switch unit and configured for dissipating heat from the electronic device; and
        a first control module connected to the first power supply and capable of sending a first group of control information to the at least one first fan and the second switch unit; and
    a second power supply device comprising:
        a second power supply capable of controlling the second switch unit to turn on and turn off;
        at least one second fan connected to the second switch unit and configured for dissipating heat from the electronic device; and
        a second control module connected to the second power supply and capable of sending a second group of control information to the at least one second fan and the first switch unit;
    wherein both the first power supply and the second power supply are configured for powering the at least one first fan and the at least one second fan, the first switch is turned on to allow the second group of control information to control the at least one first fan in response to the first power supply stops working, and the second switch is turned on to allow the first group of control information to control the at least one second fan in response to the second power supply stops working.

2. The electronic device of claim 1, wherein the first group of control information comprises at least one first control signal configured for controlling the rotation speed of the at least one first fan, and at least one first detecting signal configured for detecting the actual rotation speed of the at least one first fan.

3. The electronic device of claim 1, wherein the second group of control information comprises at least one second control signal configured for controlling the rotation speed of the at least one second fan, and at least one second detecting signal configured for detecting the actual rotation speed of the at least one second fan.

4. The electronic device of claim 1, wherein the first power supply is capable of sending a first control signal to control the first switch unit, the first switch is turned off in response to the first power supply works normally, and the first switch unit is turned on in response to the first power supply stops working.

5. The electronic device of claim 1, wherein the second power supply is capable of sending a second control signal to control the second switch unit, the second switch is turned off in response to the second power supply works normally, and the second switch unit is turned on in response to the second power supply stops working.

6. The electronic device of claim 1, wherein the first power supply device further comprises a first sensor connected to the first control module, and is configured for sensing temperature of the electronic device, and transmitting the sensed temperature to the first control module; the first control module sends out the first group of control information based on the sensed temperature received from the first sensor.

7. The electronic device of claim 6, wherein the first sensor is connected to the first control module via an inter-integrated circuit (I2C) bus.

8. The electronic device of claim 1, wherein the second power supply device further comprises a second sensor connected to the second control module, and is configured for sensing temperature of the electronic device, and transmitting the sensed temperature to the second control module; the second control module sends out the second group of control information based on the sensed temperature received from the second sensor.

9. The electronic device of claim 8, wherein the second sensor is connected to the second control module via the I2C bus.

* * * * *